(12) United States Patent
Cheung et al.

(10) Patent No.: US 6,245,670 B1
(45) Date of Patent: Jun. 12, 2001

(54) METHOD FOR FILLING A DUAL DAMASCENE OPENING HAVING HIGH ASPECT RATIO TO MINIMIZE ELECTROMIGRATION FAILURE

(75) Inventors: Robin Cheung, Cupertino; Sergey Lopatin, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/253,480

(22) Filed: Feb. 19, 1999

(51) Int. Cl.$^7$ ............................................... H01L 21/4763
(52) U.S. Cl. ........................ 438/637; 438/640; 438/639
(58) Field of Search .................................... 438/637, 629, 438/678, 687, 638, 639, 640

(56) References Cited

U.S. PATENT DOCUMENTS

| | | | |
|---|---|---|---|
| 5,891,513 | * 4/1999 | Dubin et al. | 438/678 |
| 5,897,369 | * 4/1999 | Jun | 438/629 |
| 6,010,962 | * 1/2000 | Liu et al. | 438/687 |
| 6,054,384 | * 4/2000 | Wang et al. | 438/637 |

OTHER PUBLICATIONS

S. Lopatin, Y. Shacham–Diamand, V.M. Dubin, P.K. Vasudev, B. Zhao, and J. Pellerin, *Conformal Electroless Copper Deposition for Sub–0.5μm Interconnect Wiring of Very High Aspect Ratio*, Electrochemical Society Proceedings 96–19, pp. 271–288.

* cited by examiner

*Primary Examiner*—David Nelms
*Assistant Examiner*—Dung A Le
(74) *Attorney, Agent, or Firm*—Monica H. Choi

(57) ABSTRACT

A method for effectively filling a dual damascene opening having a via hole and a trench that are contiguous openings uses a two step deposition process. The method includes a step of filling the via hole by electroless deposition of a first conductive material into the via hole. A second conductive material is at a bottom wall of the via hole, and the second conductive material at the bottom wall of the via hole acts as an autocatalytic surface during the electroless deposition of the first conductive material within the via hole. The method also includes the step of depositing a seed layer of a third conductive material to cover walls of the trench and includes the step of filling the trench by electroplating deposition of the third conductive material from the seed layer into the trench. The present invention may be used to particular advantage for small geometry integrated circuits when the conductive material filling the via hole and the trench is copper. By first filling the via hole using electroless deposition, void formation and poor via contact is prevented. In addition, the more widely available and easily manufacturable electroplating deposition process is still used for filling the trench.

8 Claims, 4 Drawing Sheets

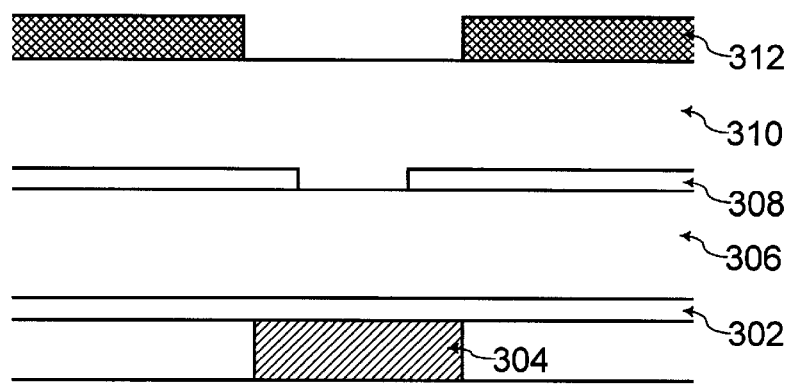
FIG. 3A (Prior Art)
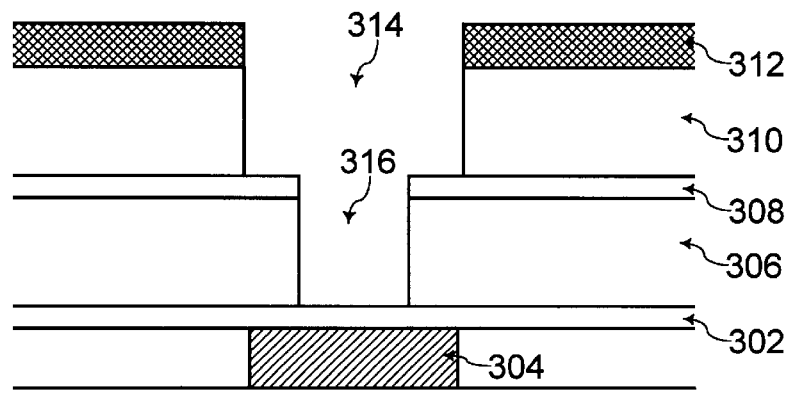
FIG. 3B
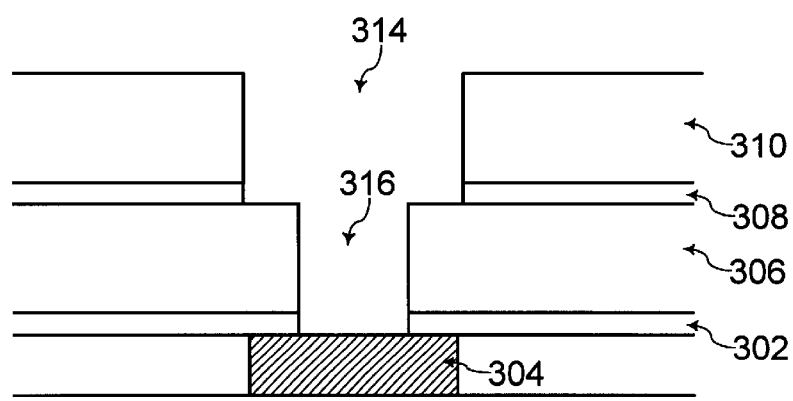
FIG. 3C
FIG. 3

US 6,245,670 B1

METHOD FOR FILLING A DUAL DAMASCENE OPENING HAVING HIGH ASPECT RATIO TO MINIMIZE ELECTROMIGRATION FAILURE

TECHNICAL FIELD

This invention relates to metallization during fabrication of integrated circuits, and more particularly, to a method for filling a high aspect ratio dual damascene opening having a via hole and a trench using electroless deposition for filling the via hole and electroplating deposition for filling the trench, such that electromigration failure is minimized.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield during IC fabrication. Such advantages are a driving force to constantly scale down IC dimensions.

With the scaling down of integrated circuit dimensions, openings, which are etched within the integrated circuit, are reduced in size. The aspect ratio of the opening, which is defined as the ratio of the depth of the opening to the width of the opening, increases with scaling down of integrated circuit dimensions.

The present invention is described with copper metallization for small geometry integrated circuits. However, the present invention may be used with any other conductive material that is amenable for small geometry integrated circuits aside from just the example of copper, as would be apparent to one of ordinary skill in the art from the description herein.

As an integrated circuit is scaled down, metallization, which interconnects devices on the integrated circuit, is also scaled down. Given the concerns of electromigration failure and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

However, copper lines cannot be etched using conventional etching processes as used for aluminum. Thus, copper lines are typically fabricated using a damascene etch process. In such a process, a trench is etched within an insulating layer. That trench is then filled with copper. The surface of the integrated circuit is then polished such that the copper line is contained within the trench.

Referring to FIG. 1, integrated circuits typically include multi-level metallization. A first metal line 102 is contained within a first trench 104 etched in a first trench insulating layer 106. A second metal line 108 is contained within a second trench 110 etched in a second trench insulating layer 112. The first metal line 102 is on a first metallization level on the integrated circuit, and the second metal line 108 is on a second metallization level on the integrated circuit. A via interconnects the metal lines 102 and 108 on the two different metallization levels. A via plug 114 is comprised of a conductive material and is disposed within a via hole 116 etched in a via insulating layer 118. The insulating layers 106, 112, and 118 are comprised of any insulating material such as any form of oxides as is known to one of ordinary skill in the art.

Referring to FIG. 2, if the second trench 110 and the via hole 116 were not filled with a conductive material, a top view of the integrated circuit of FIG. 1 shows the second trench 110 running over the via hole 116. The first metal line 102 is disposed on the bottom of the via hole 116. FIG. 1 is a cross-sectional view of the integrated circuit of FIG. 2 along line AA after the via hole 116 and the second trench 110 have been filled with a conductive material.

A dual damascene etch refers to an etching process whereby a via hole and a trench are etched away with one etching step or a series of etching steps. Referring to FIG. 3A (which shows a cross-section along line AA of the integrated circuit of FIG. 2), a dual damascene etch process includes a step of depositing a bottom nitride layer 302 adjacent a first metal layer 304. A via insulating layer 306 is deposited adjacent the bottom nitride layer 302.

A via masking layer 308 is deposited adjacent the via insulating layer 306. The via masking layer 308 is etched to have a via pattern for defining a via hole in the via insulating layer 306. The via masking layer typically is comprised of a hard mask material such as nitride or any other type of dielectric material which is known to one of ordinary skill in the art to be an etch-stop material.

In addition, the via masking layer is disposed with respect to the first metal layer 304 such that the first metal layer 304 is exposed at the bottom wall of a via hole 316. In this manner, a first conductive material filled within the via hole 316 forms a conductive path with the first metal layer 304.

A trench insulating layer 310 is deposited adjacent the via masking layer 308. Then, a photoresist layer 312 is deposited adjacent the trench insulating layer 310. The photoresist layer 312 is further processed to have a trench pattern for defining a trench in the trench insulating layer 310. The via pattern in the via masking layer 308 and the trench pattern in the photoresist layer 312 are aligned such that the trench and the via hole form a contiguous opening. In this manner, the first conductive material filled within the via hole forms a conductive path with a second conductive material filled within the trench, as illustrated in FIGS. 1 and 2.

Referring to FIG. 3B, a trench 314 is etched out of the trench insulating layer 310 with the photoresist layer 312 defining the size, shape, and location of the trench 314. Furthermore, in a dual damascene etch process, the via hole 316 is also etched out of the via insulating layer 306. Referring to FIG. 3A, the trench insulating layer 310 abuts the via insulating layer 306. Thus, using a dual damascene etch process, the trench 314 and the via hole 316 are etched with one etching step, and the trench 314 and the via hole 316 are contiguous openings.

Referring to FIG. 3C, any part of the masking layers 308 and 312 (and the nitride layer 302) that are exposed are etched away. Then, the via hole 316 and the trench 314 are filled with conductive material. The conductive material in the via hole 316 forms a conductive path between the first metal layer 304 and the conductive material in the trench 314.

Referring to FIGS. 3C and 4, the dual damascene opening is comprised of the via hole 316 and the trench 314 that are contiguous openings. The first metal layer 304 is exposed at the bottom wall of the via hole 316. Referring to FIG. 4, the first metal layer 304 may be coupled via a tungsten plug 402 to an active area of an integrated circuit.

Referring to FIG. 4, in the prior art method for filling the dual damascene opening, a seed layer 404 of copper is deposited into the via hole 316 and the trench 314. Then the via hole 316 and the trench 314 are filled with copper by electroplating deposition of copper from the seed layer 404. In such a process, a voltage bias is applied on the wafer having the dual damascene structure of FIG. 4 such that a reduction of copper ions results in deposition of copper onto the wafer, as known to one of ordinary skill in the art.

Referring to FIG. 4, as geometries of integrated circuit structures are scaled down, the aspect ratio of the trench 314 and especially of the via hole 316 increases as the width of the openings are scaled down. Thus, conformal deposition of the seed layer 404 into the corners of the via hole 316 is more difficult to achieve. As illustrated in FIG. 4, the seed layer 404 may not reach the corners of the via hole 316, and in that case, the copper plug within the via hole 316 does not make good contact with the first metal layer 304. Such poor contact of the via plug with the first metal layer 304 results in a high rate of electromigration failure of the via plug within the via hole 316 and thus in degradation of integrated circuit performance. With some high aspect ratio via holes, such poor contact may result in complete electromigration failure of the integrated circuit.

In addition, during electroplating of copper from the seed layer 404, copper is deposited from the seed layer on the side walls of the via hole 316 as illustrated in FIG. 4. With the high aspect ratio via hole 316, as copper is deposited from the side walls toward the top of the via hole 316, the via hole 316 may close off with copper deposition from the side walls toward the top of the via hole 316. In that case, a void 406 which is an opening within the via plug or a plurality of such voids may form within the via plug. Such voids result in higher electromigration failure of the via plug and thus in degradation of integrated circuit performance. With some high aspect ratio via holes, such voids may lead to complete electromigration failure of the integrated circuit.

Thus, a method for compactly filling dual damascene openings having high aspect ratio is desired such that electromigration failure within small geometry integrated circuits is minimized.

SUMMARY OF THE INVENTION

Accordingly, a primary object of the present invention is to more effectively fill dual damascene openings having high aspect ratio such that electromigration failure within small geometry integrated circuits is minimized.

In a general aspect, the present invention is a method for filling a dual damascene opening having a via hole and a trench that are contiguous openings. The method of the present invention includes the step of filling the via hole by electroless deposition of a first conductive material into the via hole. A second conductive material is at a bottom wall of the via hole, and the second conductive material at the bottom wall of the via hole is used as an autocatalytic surface during the electroless deposition of the first conductive material within the via hole. Furthermore, a seed layer of a third conductive material is deposited to cover walls of the trench. Then, the trench is filled by electroplating deposition of the third conductive material from the seed layer into the trench.

The present invention may further include the step of depositing a diffusion barrier layer to cover the walls of the trench before the step of depositing a seed layer to cover the wall of the trench. In that case, the diffusion barrier layer impedes diffusion of the third conductive material from the trench into any dielectric material surrounding the trench.

The present invention may be used to particular advantage when the first conductive material, the second conductive material, and the third conductive material are copper for fine line metallization for small geometry integrated circuit fabrication.

Thus, the present invention uses a two-step deposition process to fill a dual damascene opening. The via hole is first filled with the conductive material exposed at the bottom wall of the via hole acting as the autocatalytic surface during the electroless deposition of the first conductive material within the via hole. In this manner, the via hole is filled compactly from the bottom wall of the via hole up toward the top of the via hole. Because the bottom wall of the via hole acts as the autocatalytic surface during the electroless deposition of the first conductive material within the via hole, the corners of the via hole are more compactly filled with the first conductive material. In addition, because the via hole is filled from the bottom wall of the via hole up toward the top of the via hole, void formation within the via plug is minimized with the present invention.

The trench is then filled by electroplating deposition of conductive material from a seed layer deposited into the trench. The electroplating deposition process which is a more widely available and easily manufacturable process is still used for filling the trench which typically has lower aspect ratio than the via hole.

These and other features and advantages of the present invention will be better understood by considering the following detailed description of the invention which is presented with the attached drawings.

BRIEF DESCRIPTION OF THE DRAWINGS

FIG. 3 including FIGS. 3A, 3B, and 3C, shows cross-sectional views depicting the steps of etching a dual damascene opening having a trench and a via hole;

The figures referred to herein are drawn for clarity of illustration and are not necessarily drawn to scale. Elements having the same reference number in FIGS. 1, 2, 3, 4, 5, 6, and 7 refer to elements having similar structure and function.

DETAILED DESCRIPTION

The dual damascene opening having the trench 314 and the via hole 316 that are contiguous openings are filled using a two step deposition process according to the present invention. The via hole 316 is filled using electroless deposition, and the trench 314 is then filled using electroplating deposition, according to the present invention.

Figure 1:
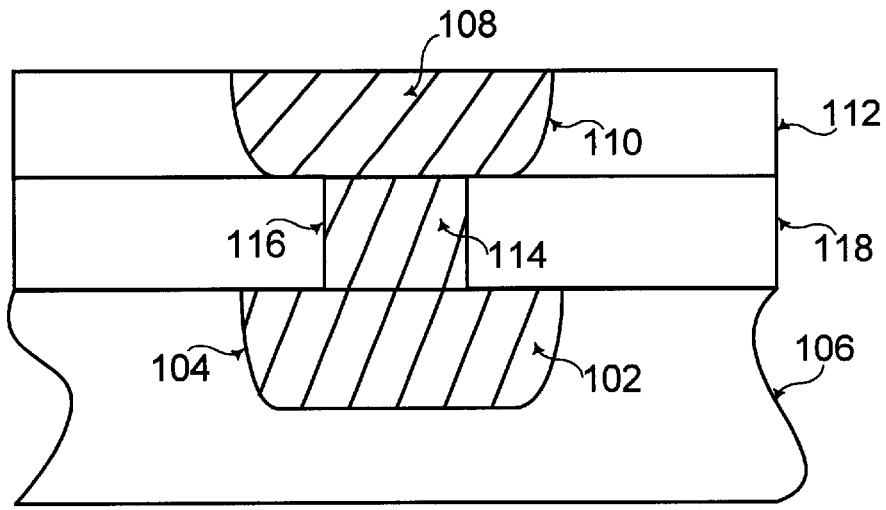
FIG. 1 shows a cross-section of multi-level metallization in an integrated circuit including a via for interconnecting metal lines on different levels.
Figure 2:
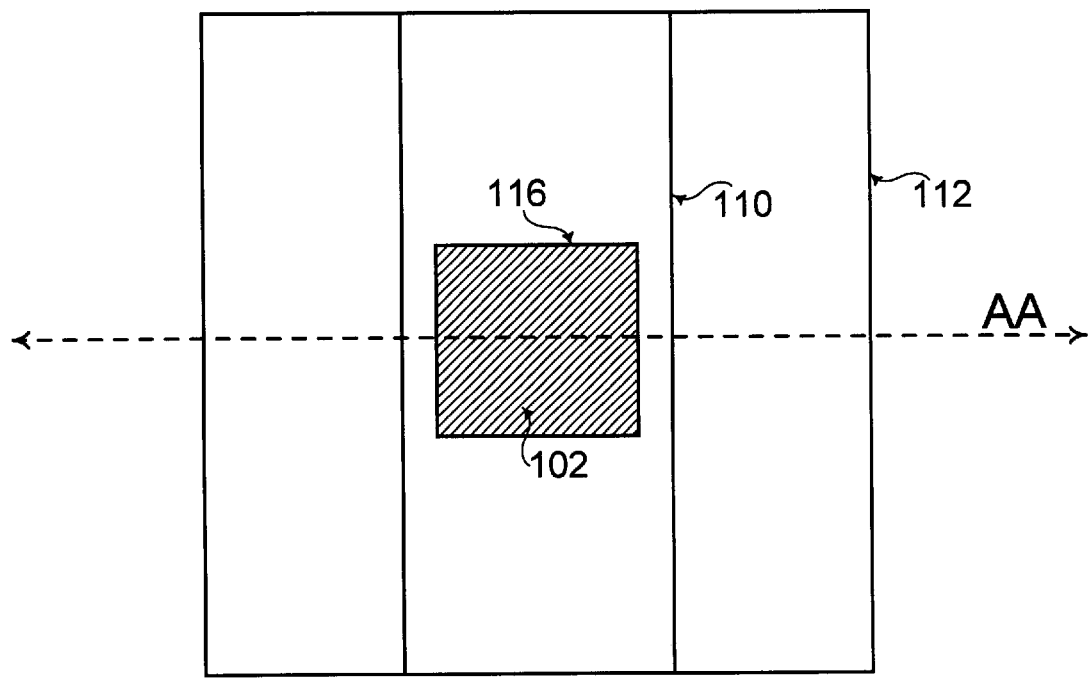
FIG. 2 shows a top view of the integrated circuit of FIG. 1.
Figure 4:
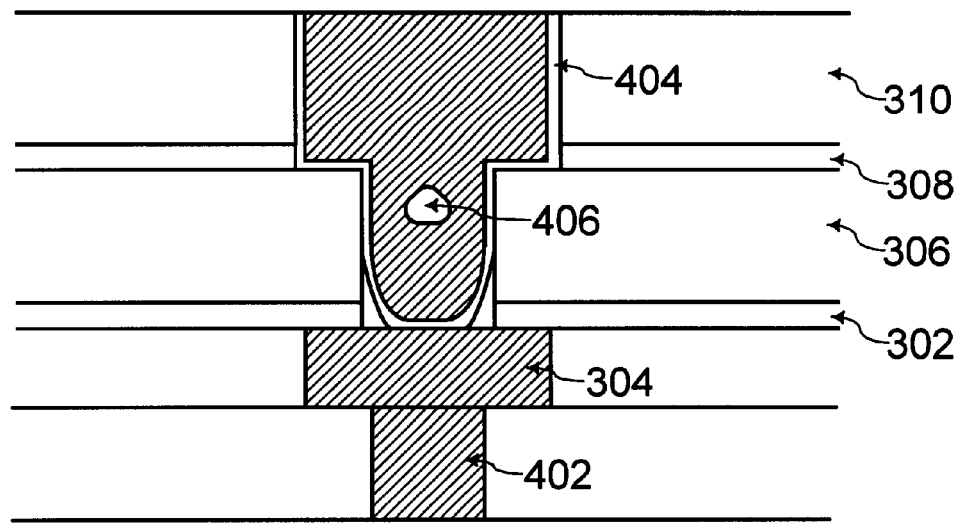
FIG. 4 shows filling the dual damascene opening of FIG. 3 using electroplating deposition for filling the trench and the via hole, according to the prior art.
Figure 5:
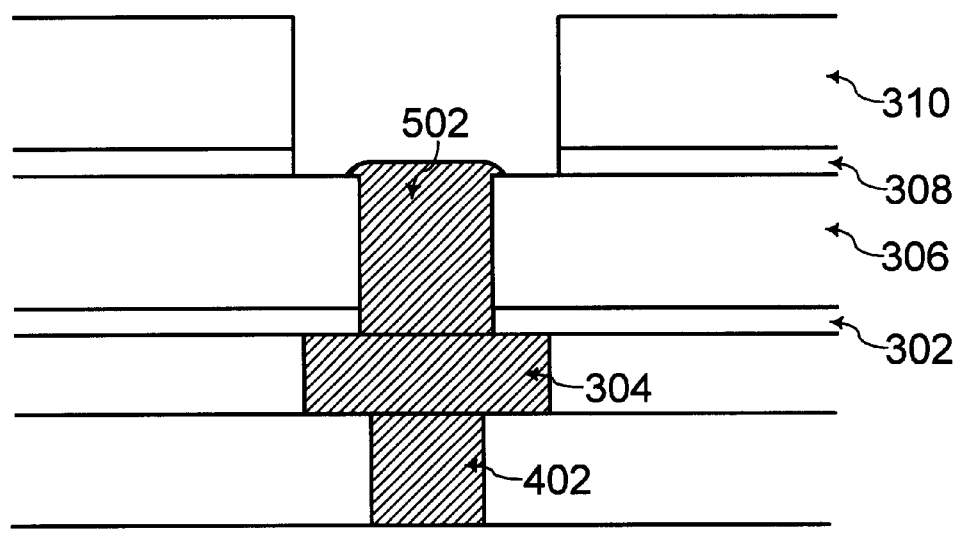
FIG. 5 shows a step of filling the via hole of the dual damascene opening of FIG. 3 using electroless deposition, according to the present invention.

Referring to FIGS. 3C and 5, the via hole 316 is filled with a first conductive material by electroless deposition. Referring to FIG. 3C, the first metal layer 304 is exposed at the bottom wall of the via hole 316. The first metal layer 304 is comprised of a second conductive material, and this second conductive material exposed at the bottom wall of the via hole 316 acts as an autocatalytic surface during the electroless deposition of the first conductive material within the via hole. Thus, the via hole 316 is filled with the first conductive material from the bottom wall up toward the top of the via hole 316. When the first conductive material sufficiently fills the via hole 316 as shown in FIG. 5, a via plug 502 of the first conductive material fills the via hole 316, and the electroless deposition process is stopped.

In this manner, because the bottom wall of the via hole acts as the autocatalytic surface during the electroless deposition of the first conductive material within the via hole, the corners of the via hole are more compactly filled with the first conductive material. Thus, the via plug 502 makes good contact with the first metal layer 304. In addition, with the present invention, the first conductive material is not deposited from the side walls toward the top of the via hole 316 as in the prior art. Rather, because the via hole is filled from the bottom wall of the via hole up toward the top of the via hole, void formation within the via plug is minimized with the present invention.

Various electroless deposition processes for filling openings within an integrated circuit are known to one of ordinary skill in the art. Any type of electroless deposition processes known to one of ordinary skill in the art may be used for filling the via hole 316 in the method of the present invention, as would be apparent to one of ordinary skill in the art from the description herein.

Figure 6:
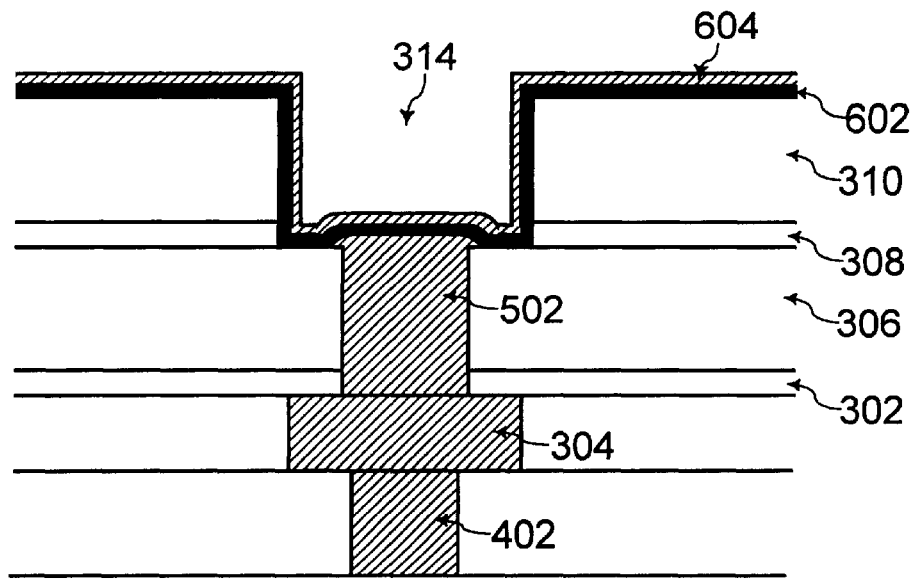
FIG. 6 shows a step of depositing a diffusion barrier layer and a seed layer into the trench of the dual damascene opening of FIG. 3 after the electroless deposition step of FIG. 5, according to the present invention.

Furthermore, after the electroless deposition of the first conductive material within the via hole 316, the trench within the dual damascene opening is filled by electroplating deposition. Referring to FIG. 6, a diffusion barrier layer 602 may be deposited to cover the walls of the trench 314. In that case, the diffusion barrier layer impedes diffusion of the conductive material from the trench into any dielectric material surrounding the trench.

Such a diffusion barrier layer is typically used when the conductive material within the trench line 314 is copper. Copper is a mid-bandgap impurity in silicon and silicon dioxide. Thus, copper may diffuse easily into these common integrated circuit materials. This diffusion of copper may degrade the performance of integrated circuits. Thus, the diffusion barrier layer 602 is deposited to cover the walls of the trench 314 such that diffusion of copper from the trench 314 into any dielectric material surrounding the trench 314 is impeded.

(In addition, note that a diffusion barrier layer may be deposited onto the side walls of the via hole 316 before filling the via hole 316 to impede diffusion of the conductive material from the via hole 316 into any dielectric material surrounding the via hole 316. However, such a barrier layer is not shown in FIGS. 5, 6, and 7 for clarity of illustration.)

Referring to FIG. 6, after deposition of the diffusion barrier layer 602, a seed layer 604 of a third conductive material is deposited on the walls of the trench 314. In the case copper is used to fill the trench 314, the seed layer 604 is typically also comprised of copper. The seed layer 604 is typically needed for the electroplating deposition process used in filling the trench 314. The seed layer 604 may be deposited by one of chemical vapor deposition (CVD), plasma enhanced chemical vapor deposition (PECVD), or ion metal plasma deposition (IMP), as known to one of ordinary skill in the art.

Figure 7:
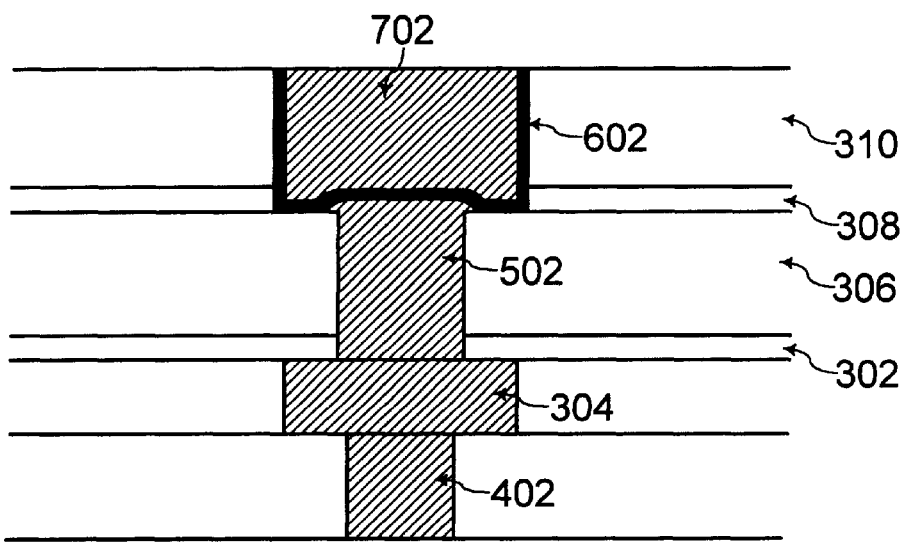
FIG. 7 shows a step of filling the trench of the dual damascene opening of FIG. 3 using electroplating deposition from the seed layer of FIG. 6, according to the present invention.

Referring to FIG. 7, the trench 314 is filled with the third conductive material by electroplating deposition from the seed layer 602. A metal trench line 702 of the third conductive material is then formed within the trench 702.

Various electroplating deposition processes for filling openings within an integrated circuit are known to one of ordinary skill in the art. Any type of electroplating deposition processes known to one of ordinary skill in the art may be used for filling the trench 314 in the method of the present invention, as would be apparent to one of ordinary skill in the art from the description herein.

The electroplating deposition process from the seed layer 604 would result in deposition of the third conductive material all over the wafer having the dual damascene structure of the present invention. Thus, after the electroplating deposition process, the surface of the wafer is polished using a chemical mechanical polishing process as known to one of ordinary skill in the art. With such a polishing process, the third conductive material is confined to be contained within the trench 314 as shown in FIG. 7.

In this manner, the trench 314 is filled by electroplating deposition of conductive material from the seed layer 604 deposited into the trench after the via hole 316 is filled using an electroless deposition process. The electroplating deposition process which is a more widely available and easily manufacturable process is still used for filling the trench 314 which typically has lower aspect ratio than the via hole 316. Thus, void formation is minimized as the via hole 316 having high aspect ratio is compactly filled with the conductive material at the bottom wall of the via hole 316 acting as the autocatalytic surface during the electroless deposition of the first conductive material within the via hole. Then, the trench 314 having relatively lower aspect ratio is filled using an electroplating deposition process which is a more widely available and easily manufacturable process.

The present invention may be used to particular advantage for fabrication of small geometry integrated circuits having copper metallization. In that case, the first conductive material filling the via hole 316 is copper, the second conductive material of the first metal layer 304 is copper, and the third conductive material of the seed layer 604 and the trench line 702 is copper. Copper is advantageous for small geometry metallization because of the lower bulk resistivity and the higher electromigration tolerance of copper. In addition, various electroless deposition processes and electroplating deposition processes for copper are known to one of ordinary skill in the art.

In addition, the via insulating layer 306 and the trench insulating layer 310 may be comprised of a dielectric material having a relatively low dielectric constant. As known to one of ordinary skill in the art, such insulating layers of dielectric material having a relatively low dielectric constant are amenable for lower capacitance and thus for higher speed circuit performance.

The foregoing is by way of example only and is not intended to be limiting. For example, the advantageous features of the present invention may be used when any type of conductive material amenable for small geometry integrated circuit is used for metallization. Furthermore, as will be understood by those skilled in the art, the integrated circuit structures described herein may be made or used in the same way regardless of their position and orientation. Accordingly, it is to be understood that terms and phrases such as "top," "bottom wall," and "side wall" as used herein refer to the relative location and orientation of various portions of the structures with respect to one another, and are not intended to suggest that any particular absolute orientation with respect to external objects is necessary or required. The invention is limited only as defined in the following claims and equivalents thereof.

We claim:

1. A method for filling a dual damascene opening having a via hole and a trench that are contiguous openings, the method including the steps of:
   A. filling said via hole by electroless deposition of a first conductive material into said via hole, wherein a second conductive material is at a bottom wall of said via hole;
   B. using said second conductive material at the bottom wall of said via hole as an autocatalytic surface during said electroless deposition of said first conductive material within said via hole;
   C. depositing a seed layer of a third conductive material to cover walls of said trench; and
   D. filling said trench by electroplating deposition of said third conductive material from said seed layer into said trench.

2. The method of claim 1, further including the step of:
   depositing a diffusion barrier layer to cover said walls of said trench before said step C, wherein said diffusion barrier layer impedes diffusion of said third conductive material from said trench into any dielectric material surrounding said trench.

3. The method of claim 1, further including the step of:
   polishing a wafer having said filled dual damascene opening such that the third conductive material is contained within said trench on a top surface of said wafer.

4. The method of claim 1, wherein said first conductive material is same as said second conductive material.

5. The method of claim 4, wherein said first conductive material and said second conductive material are copper.

6. The method of claim 5, wherein said third conductive material is copper.

7. The method of claim 1, wherein said via hole and said trench are openings within a respective layer of dielectric material having low dielectric constant.

8. A method for forming a dual damascene metallization structure having a via hole and a trench that are contiguous openings, the method including the steps of:
   A. etching said via hole of said dual damascene metallization structure within a first layer of dielectric material having low dielectric constant, wherein said via hole is formed on top of a copper metal line such that copper is at a bottom wall of said via hole;
   B. etching said trench of said dual damascene metallization structure within a second layer of dielectric material having low dielectric constant, wherein said trench is formed to be contiguous with said via hole;
   C. filling said via hole by electroless deposition of copper into said via hole;
   D. using said copper at the bottom wall of said via hole as an autocatalytic surface during said electroless deposition of copper within said via hole;
   E. depositing a diffusion barrier layer to cover said walls of said trench, wherein said diffusion barrier layer impedes diffusion of said copper from said trench into said second layer of dielectric material surrounding said trench;
   F. depositing a seed layer of copper to cover walls of said trench;
   G. filling said trench by electroplating deposition of copper from said seed layer into said trench; and
   H. polishing a wafer having said filled dual damascene opening such that copper is contained within said trench on a top surface of said wafer.

* * * * *